(12) United States Patent
Bruel

(10) Patent No.: US 9,625,504 B2
(45) Date of Patent: Apr. 18, 2017

(54) METHOD FOR DETERMINING A POWER CONSUMPTION, SUPERVISION SYSTEM AND ELECTRIC INSTALLATION COMPRISING APPLICATION THEREOF

(71) Applicant: SCHNEIDER ELECTRIC INDUSTRIES SAS, Rueil-Malmaison (FR)

(72) Inventor: Marc Bruel, Corenc (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 272 days.

(21) Appl. No.: 14/366,565

(22) PCT Filed: Dec. 7, 2012

(86) PCT No.: PCT/FR2012/052830
§ 371 (c)(1),
(2) Date: Jun. 18, 2014

(87) PCT Pub. No.: WO2013/093281
PCT Pub. Date: Jun. 27, 2013

(65) Prior Publication Data
US 2014/0333294 A1 Nov. 13, 2014

(30) Foreign Application Priority Data
Dec. 20, 2011 (FR) ...................... 11 03957

(51) Int. Cl.
*G01R 22/06* (2006.01)
*G01R 21/06* (2006.01)
(Continued)

(52) U.S. Cl.
CPC ........... *G01R 22/061* (2013.01); *G01R 21/06* (2013.01); *G01R 21/133* (2013.01); *G01R 19/2513* (2013.01)

(58) Field of Classification Search
CPC .. G01R 21/133; G01R 21/06; G01R 19/2513; G01R 22/061; G01R 19/10; G01R 11/00
(Continued)

(56) References Cited

U.S. PATENT DOCUMENTS 5,572,438 A 11/1996 Ehlers et al.
5,684,710 A 11/1997 Ehlers et al.
(Continued)

FOREIGN PATENT DOCUMENTS

DE WO 2011002735 A1 * 1/2011 ............ G01D 4/004
EP 0 853 364 7/1998
(Continued)

OTHER PUBLICATIONS

Schneider Electric, Harness the data collected from your energy system: PowerLogic System Manager Software (2009).*
(Continued)

*Primary Examiner* — Tung X Nguyen
*Assistant Examiner* — Robert P Alejnikov, Jr.
(74) *Attorney, Agent, or Firm* — Oblon, McClelland, Maier & Neustadt, L.L.P.

(57) ABSTRACT

To determine a consumption in a group of branches of individual distribution of electrical energy, a method includes: a) detecting a change in electrical consumption in the branches, b) reading information relating to an electric current in a specific branch, then c) using the information, establishing an indication according to which the change took place in the specific branch, then d) determining, using measurements taken of an overall power supply of the group of branches before the change and measurements taken of
(Continued)

the overall power supply after the change, in addition to the indication, an individual energy consumption of the specific branch.

13 Claims, 3 Drawing Sheets

(51) Int. Cl.
 *G01R 21/133* (2006.01)
 *G01R 19/25* (2006.01)
(58) Field of Classification Search
 USPC ......... 324/140 R, 103 R, 113, 114, 141, 157
 See application file for complete search history.

(56) References Cited

U.S. PATENT DOCUMENTS

| | | | |
|---|---|---|---|
| 5,696,695 | A | 12/1997 | Ehlers et al. |
| 7,693,670 | B2 | 4/2010 | Durling et al. |
| 8,463,452 | B2 | 6/2013 | Masters et al. |
| 8,554,501 | B2 | 10/2013 | Diop et al. |
| 2008/0140326 | A1 | 6/2008 | Scholtz et al. |
| 2009/0045804 | A1* | 2/2009 | Durling .................. G01D 4/008 324/140 R |
| 2009/0088990 | A1 | 4/2009 | Schweitzer, III et al. |
| 2009/0322314 | A1* | 12/2009 | Long .................... G01R 21/133 324/142 |
| 2010/0287489 | A1 | 11/2010 | Alles |
| 2010/0301837 | A1 | 12/2010 | Higuma et al. |
| 2011/0074382 | A1 | 3/2011 | Patel |
| 2011/0098952 | A1 | 4/2011 | Long et al. |
| 2011/0153246 | A1* | 6/2011 | Donaldson ......... G01R 21/1331 702/65 |
| 2011/0161021 | A1* | 6/2011 | Reid .................. G01R 19/2513 702/61 |
| 2012/0290230 | A1 | 11/2012 | Berges Gonzalez et al. |

FOREIGN PATENT DOCUMENTS

| | | |
|---|---|---|
| EP | 2 000 780 | 12/2008 |
| EP | 2 026 299 | 2/2009 |
| EP | 2 241 898 | 10/2010 |
| JP | 2003-070186 | 3/2003 |
| WO | 2009/158202 | 12/2009 |
| WO | 2010/014762 | 2/2010 |
| WO | 2010/037988 | 4/2010 |
| WO | 2011/002735 | 1/2011 |
| WO | 2011/037679 | 3/2011 |

OTHER PUBLICATIONS

Chung-Ping Young, et al., "Digital Power Metering Manifold", IEEE Transactions on Instrumentation and Measurement, vol. 47, No. 1, pp. 224-228, XP011024460, Feb. 1998.
International Search Report issued Feb. 4, 2013, in PCT/FR12/052830, filed Dec. 7, 2012.
U.S. Appl. No. 14/364,891, filed Jun. 12, 2014, Bruel.

* cited by examiner

METHOD FOR DETERMINING A POWER CONSUMPTION, SUPERVISION SYSTEM AND ELECTRIC INSTALLATION COMPRISING APPLICATION THEREOF

BACKGROUND OF THE INVENTION

The invention relates to a method for determining a power consumption in an electrical installation comprising a group of several individual electricity distribution branches between several loads, and an incoming main line connecting the group of branches to an electrical power supply. The method in question is of a type according to which it comprises the action of performing in time and of recording measurements taken on the incoming main line and enabling the overall power consumed by the group of branches to be established.

The invention also relates to a monitoring system of a group of several individual electricity distribution branches between several loads in an electrical installation, of the type comprising at least:
- a device for performing measurements on an incoming main line connecting the group of branches to an electrical power supply,
- a memory for storing these measurements which enable the overall power consumed by the group of branches to be established,
- an equipment transducer of a specific branch among the branches.

The invention further relates to an electrical installation of the type comprising a group of several individual electricity distribution branches between several loads, an incoming main line connecting the group of branches to an electrical power supply.

STATE OF THE ART

Private individuals like other economical agents are showing an increasing interest in mastering their own electrical consumptions. One direction of this consumption control is based on a detailed knowledge of the different particular consumptions within a global consumption. For example, the inhabitants of a house or a lodging of another type may be interested in their electrical consumption due to heating, in that devoted to lighting and/or that due to a particular piece of equipment, without satisfying themselves with only knowing the global consumption of the lodging as a whole.

At the present time, the inhabitants of a lodging can generally have access to their overall electrical consumption by means of an electrical power meter equipping the connection line to the public distribution grid which supplies the lodging. When it is desired to know an individual consumption for example of a particular piece of equipment within the lodging, the branch on which this piece of equipment is connected is equipped with an electrical power consumption meter. The appended FIG. 1 is a diagram representing a current example of a domestic electrical installation in which several electrical power consumption meters 101 provide information on several individual consumptions constituting an overall electrical power consumption.

In this FIG. 1, the reference 102 designates a transformer connecting to a public electrical power distribution grid. A line-side incomer equipped with electrical power consumption meter 103 connects the electrical installation to this transformer 102. Identical or similar to the meter 103, each electrical power consumption meter 101 equips one of several electrical power distribution feeders to several loads 104. A hardwired network is provided to convey the different meter readings to a central electronic measurement unit 105 which groups the meter readings.

An electrical power consumption meter is both costly and bulky. When it is desired to be able to monitor several individual power consumptions within an installation, the additional cost resulting from multiplication of the electrical power consumption meters becomes consequent and may constitute a genuine obstacle to setting up a real individual consumption monitoring system. The possibility of such a multiplication of meters may in addition be hindered by the lack of available space in a number of general electrical panels currently installed in private homes.

Furthermore, research has been carried out on identification of a type of load in an installation by means of mathematical analysis of specificities in the supply current of this installation. The patents and or patent applications US-2010/0287489, JP2003/070186, WO2010/037988, WO2001/177696, EP-2,000,780, EP-2,026,299, WO1010/014762 bear witness to this research. The solutions that are proposed therein are heavy in terms of software means and are costly, without really enabling a subscriber to access the individual consumptions of the equipment constituting his electrical installation.

OBJECT OF THE INVENTION

The object of the invention is at least to enable the cost of access to knowledge of an individual electrical consumption constituting a measured overall electrical consumption, in an alternating current electrical installation, to be reduced.

According to the invention, this object is achieved by means of a method which is of the above-mentioned type and which comprises steps wherein:
a) a change in electrical consumption is detected in the installation, and
b) information relating to an electric current in a specific branch among said branches is read by means of a transducer equipping this specific branch, then
c) using said information read by means of the transducer equipping the specific branch, whether said change took place in this specific branch is determined, then
d) using both data from the measurements taken on the incoming main line before the change and data from the measurements taken on the incoming main line after the change, in addition to said indication, an individual energy specific consumption in said specific branch is determined.

Certain loads always consume the same power when they are not powered off. In other kinds of loads, the power consumed can vary between several different values, but it always varies by steps.

It has been observed that, provided that the nature of the loads in an electrical installation is taken into account, the individual power consumption of a load connected in one of several branches can be deduced whereas no measurements are available for the set of electrical quantities characterizing operation of this load. In certain cases in particular, the power consumption of a load connected in one of several branches can be deduced by means of monitoring of the changes affecting this consumption. It can be deduced from measurements of the values characterizing the overall electrical power supply of the set of branches before and after such changes, and possibly from other measurements.

However, the availability of a measurement of the quantities characterizing the overall electrical power supply of a set of several branches is a common case in electrical distribution. This case is in particular that of electrical installations in which several feeders are connected to the same incomer connecting to a public electrical power distribution grid and in which this incomer is equipped with an electrical power consumption meter. In such a case, the invention can enable the instrumentation equipping the particular branch whose consumption is to be monitored to be simplified. In particular, this instrumentation can be reduced to a current detector when only monitoring of the changes affecting the consumption in the branch is involved. A current detector is generally much less expensive and less bulky than an electrical power consumption meter. The same is the case of a current sensor or ampere meter.

The method for determining an electrical consumption can incorporate one or more other advantageous features, either alone or in combination, in particular those defined in the following.

Advantageously, step d) comprises sub-steps wherein:
d1) by combining said indication and a table establishing at least one correspondence between at least the specific branch and at least one manner of a set of several manners for determining an individual power consumption in a branch, a manner is selected from the set of manners for determining an individual consumption,
d2) using the selected manner, the specific individual power consumption is determined.

The individual distribution branches can be connected in parallel. Preferably, in the case where the electrical power supply is an alternating current supply, a specific manner of the set comprises measuring and recording an overall supply voltage of several branches, measuring and recording an intensity and phase shift values of an overall supply current of the group of several branches, and measuring and recording an intensity of a specific individual current flowing in a specific branch of the group of branches. Preferably, the specific manner comprises a step wherein:
e) using a measurement of the substantially constant overall voltage during the change, measurements of the intensity and phase shift values of the global current before and after the change, and measurements of the intensities of the specific individual current before and after the change, an individual power consumed in the specific branch is determined.

Advantageously, in step e), the individual power is determined by considering that the set of individual currents flowing in the branches of the group with the exception of the specific individual current add up to a substantially unchanged sum at the end of the change, compared with before the change, and the following two conditions have to be simultaneously fulfilled:
the global current before the change has to be substantially equal to the addition of the substantially unchanged sum to the specific individual current before the change, and
the global current after the change has to be substantially equal to the addition of the substantially unchanged sum to the specific individual current after the change.

Advantageously in step e), an aberrant solution among two possible solutions is eliminated.

The individual distribution branches can be connected in parallel. Preferably, when the electrical power supply is a direct current supply, a specific manner of the set comprises the action of performing measurements of an overall supply voltage of the group of several branches, and measurements of the intensity of a specific individual current flowing in a specific branch of the group of branches, the specific manner comprising a step wherein:
e) using a measurement of the overall voltage and a measurement of the intensity of the specific individual current, an individual power consumed in the specific branch is determined.

Advantageously, step e) comprises sub-steps wherein:
e1) using measurements of the intensity and phase shift values of the overall current before and after the change, and measurements of the intensities of the specific individual current before and after the change, said substantially unchanged sum of individual currents is determined as simultaneously complying with said two conditions,
e2) it is determined which component has to be added to the substantially unchanged sum of individual currents to obtain the overall current, this component being a determination of the specific individual current,
e3) the specific individual power is calculated as being the product of the overall voltage and of the specific individual current.

Advantageously, in sub-step e1), said substantially unchanged sum of individual currents is determined by numerically solving the following system of two equations with two unknowns:

$$\begin{cases} (X_A - X_S)^2 + (Y_A - Y_S)^2 = I_{3A}^2 \\ (X_B - X_S)^2 + (Y_B - Y_S)^2 = I_{3B}^2 \end{cases}$$

where $I_{3A}^2$ and $I_{3B}^2$ are respectively a measurement to the square of the intensity of the specific individual current before the change and a measurement to the square of the intensity of the specific individual current after the change, where $X_A$ and $Y_A$ are respectively the x-axis and the y-axis of the vector representation of the overall current as measured before the change, in a Fresnel diagram, where $X_B$ and $Y_B$ are respectively the x-axis and the y-axis of the vector representation of the overall current as measured after the change, in the Fresnel diagram, and where $X_S$ and $Y_S$ are two unknowns and are respectively the x-axis and the y-axis of the vector representation of said substantially unchanged sum of individual currents, in the Fresnel diagram, before and after the change.

Advantageously step e) comprises sub-steps in which:
an intensity value AB is determined by means of the following relation:

$$AB = \sqrt{I_A^2 + I_B^2 - 2 \times I_A \times I_B \times \cos(\psi_B - \psi_A)}$$

where $I_A$ and $\psi_A$ are respectively a measured intensity and phase shift of the overall current (I) before the change and where $I_B$ and $\psi_B$ are respectively a measured intensity and phase shift of the overall current after the change, an angle value $\psi_1$ is determined by means of the following relation:

$$\psi_1 = \arcsin\left(\frac{I_B \times \cos\psi_B - I_A \times \cos\psi_A}{AB}\right),$$

an angle value $\psi_2$ is determined by means of the following relation:

$$\psi_2 = \arccos\left(\frac{I_{3B}^2 + AB^2 - I_{3A}^2}{2 \times I_{3B} \times AB}\right)$$

where $I_{3A}$ and $I_{3B}$ are respectively a measurement of the intensity of the specific individual current before the change and a measurement of the intensity of the specific individual current after the change.

Advantageously step e) comprises a sub-step in which:
the specific individual power after the change is determined by means of the following relation:

$P_{3B} = U \times I_{3B} \times \sin(\psi_1 + \psi_2)$ where $P_{3B}$ and U are respectively said particular individual power after the change and the overall supply voltage.

Advantageously, the method for determining a power consumption comprises a step in which:
the phase shift of the specific individual current after the change is determined by means of the following relation:

$\psi_{3B} = \pi/2 - (\psi_1 + \psi_2)$ where $\psi_{3B}$ is the phase shift of the specific individual current after the change.

Advantageously, in one of the manners for determining an individual power consumption, an individual power consumed in one of the branches is determined as being equal to the difference between an overall power consumed in the group of branches before the change and an overall power consumed in the group of branches after this change.

Advantageously, in one of the manners for determining an individual power consumption, and individual power consumed in a branch of the group of branches is measured.

The object of the invention is also to provide a monitoring system which is of the above-mentioned type and of which comprises a computing device able:
to detect a change in the electrical power consumption in the installation, by communicating with at least one of the devices which are the device for performing measurement and the transducer, and
to monitor information relative to an electric current in the specific branch, originating from the transducer equipping this specific branch, then
by means of the information provided by the transducer equipping the specific branch, to indicate whether said change took place in this specific branch, then
using both the data from the measurements made on the incoming main line before the change and data from the measurements made on the incoming main line after the change, and said indication, to determine a specific individual power consumption in said specific branch.

The monitoring system according to the invention can incorporate one or more other advantageous features, either alone or in combination, in particular among those defined in the following.

Advantageously, the computing device has several manners for determining an individual power consumption in a branch and a table to establish at least one correspondence between at least one of the branches and at least one of the manners. Preferably, the computing device is able to select a specific manner from the manners for determining an individual consumption by combining said indication and the table, and for determining the specific individual power consumption using the selected specific manner.

Advantageously, for an alternating current electrical installation, the monitoring system is designed to measure and record an overall supply voltage of the group of several branches, measure and record an intensity and phase shift values of an overall supply current of the group of several branches, and measure and record an intensity of a specific individual current flowing in a specific branch of the group of branches. Preferably, the computing device comprises means for determining an individual power consumed in a specific branch using a measurement of the overall voltage during the change, measurements of the intensity and phase shift values of the overall current before and after the change, and measurements of the intensity of the specific individual current before and after the change.

Advantageously, the means for determining an individual power are able to determine this individual power by considering that the set of individual currents flowing in the branches of the group with the exception of the specific individual current add up to a substantially unchanged sum on completion of the change, compared with before the change, and that the following two conditions have to be simultaneously complied with:
the overall current before the change has to be substantially equal to the addition of the substantially unchanged sum to the specific individual current before the change, and
the overall current after the change has to be substantially equal to the addition of the substantially unchanged sum to the specific individual current after the change.

Advantageously, the computing device comprises means for eliminating an aberrant solution among two possible solutions.

Advantageously, for a direct current electrical installation, the monitoring system is designed to perform measurements of an overall supply voltage of the group of several branches, and measurements of the intensity of the specific individual current flowing in a specific branch of the group of branches. Preferably, the computing device comprises means for determining an individual power consumed in the specific branch using a measurement of the overall voltage and measurement of the intensity of the specific individual current.

Advantageously, the computing device comprises means for determining an individual power consumed in one of the branches as being equal to the difference between an overall power consumed in the group of branches before the change and an overall power consumed in the group of branches after this change.

Advantageously, the computing device is able to conduct a method as defined in the foregoing.

It is yet a further object of the invention to provide an electrical installation which is of the above-mentioned type and which comprises a monitoring system as defined in the foregoing. The device for performing measurements equips the incoming main line. A specific branch among the branches is equipped with the transducer.

BRIEF DESCRIPTION OF THE DRAWINGS

Among the appended figures.

Figure 1:
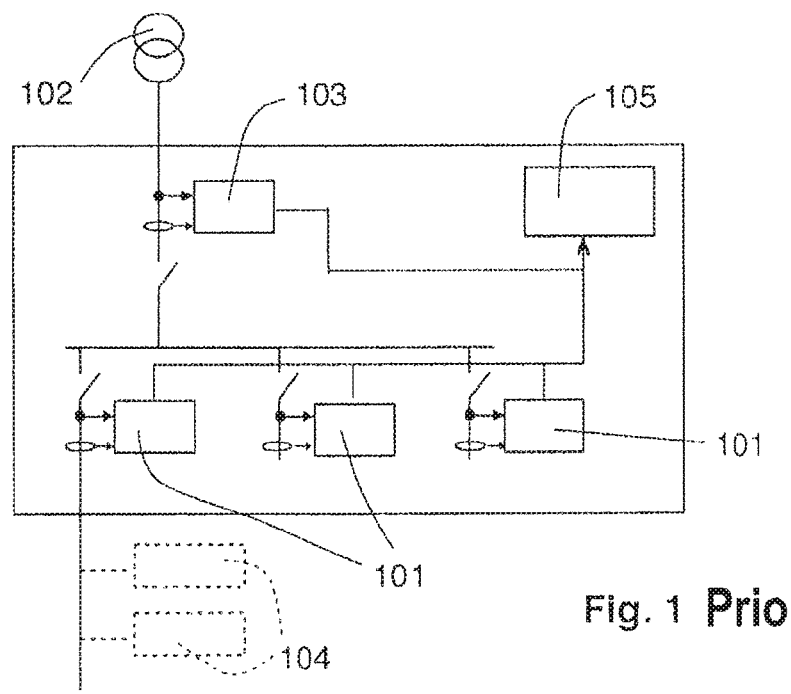
FIG. 1 is a simplified wiring diagram of an electrical installation according to an art prior to the invention.
Figure 2:
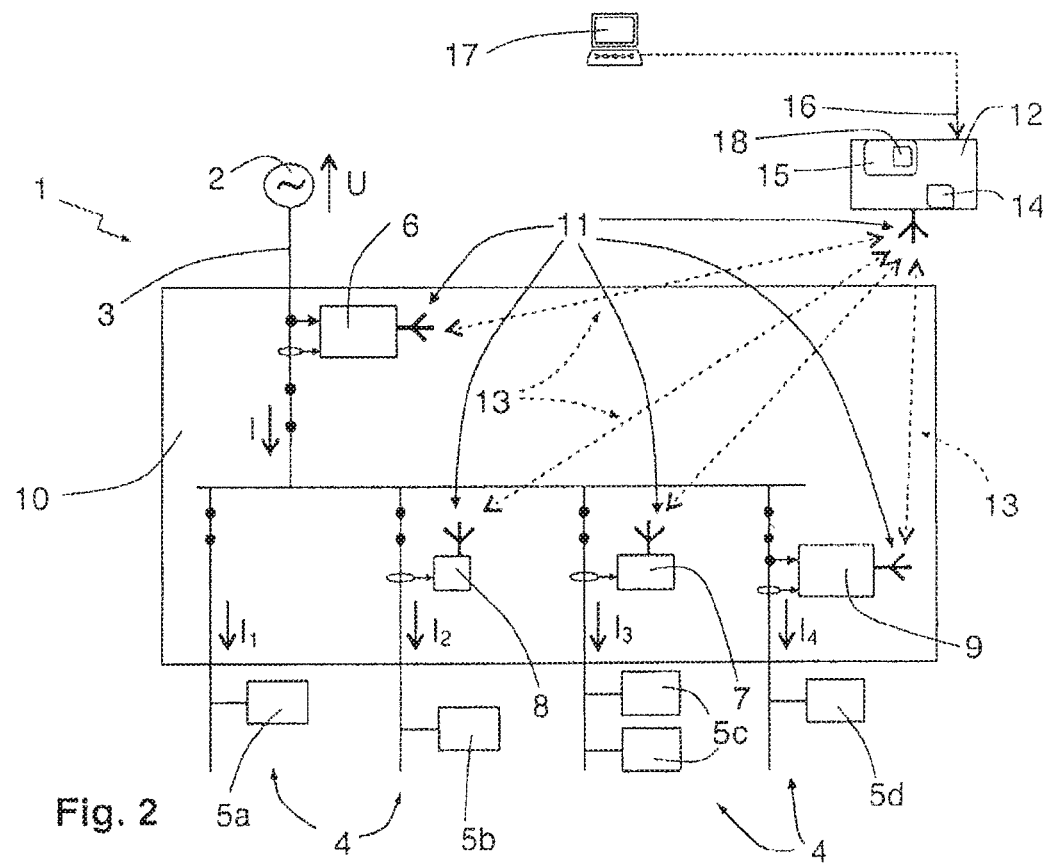
Figure 3:
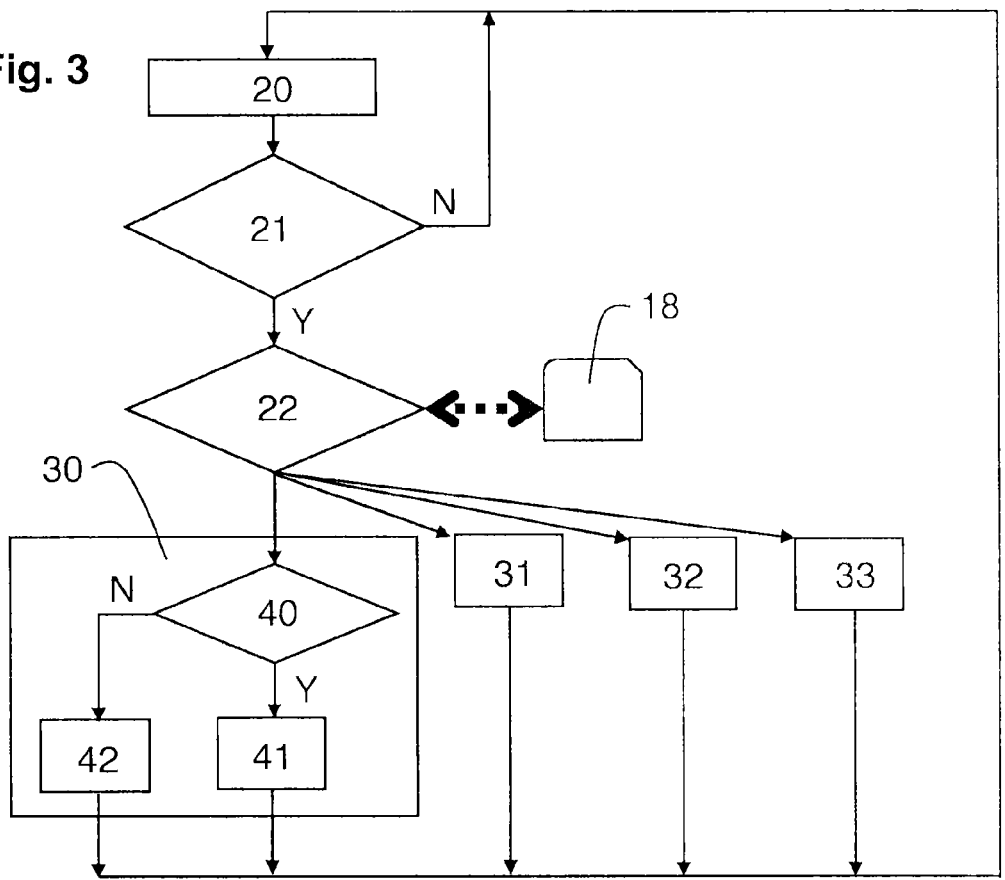
Figure 4:
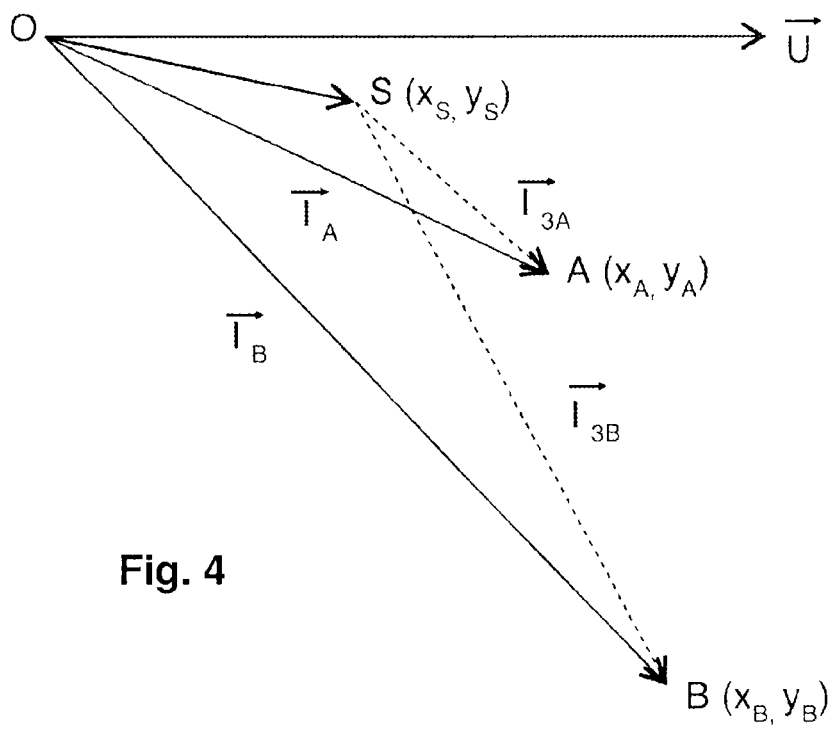
Figure 5:
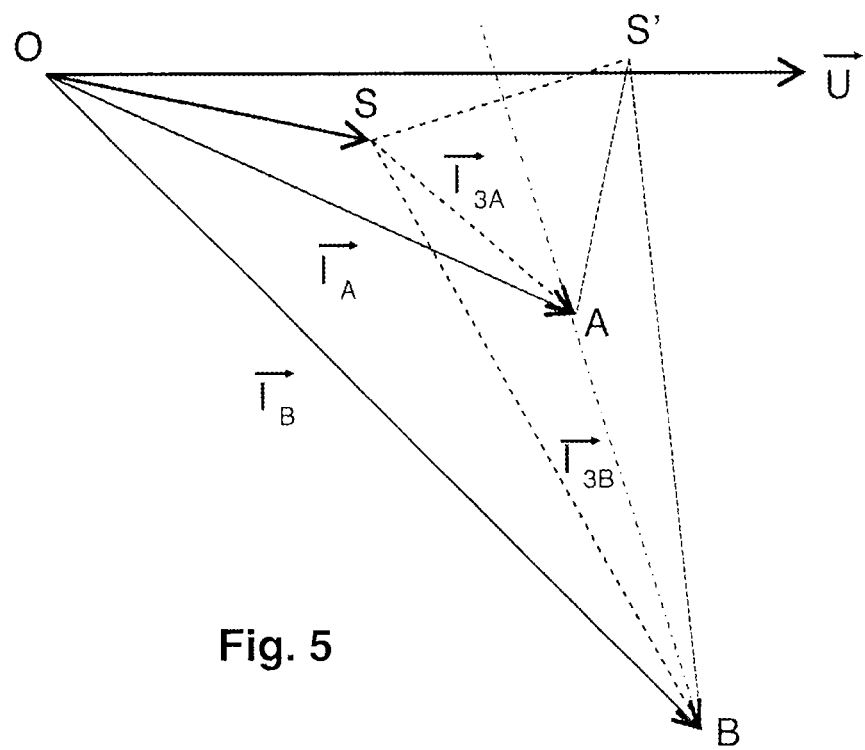
Figure 6:
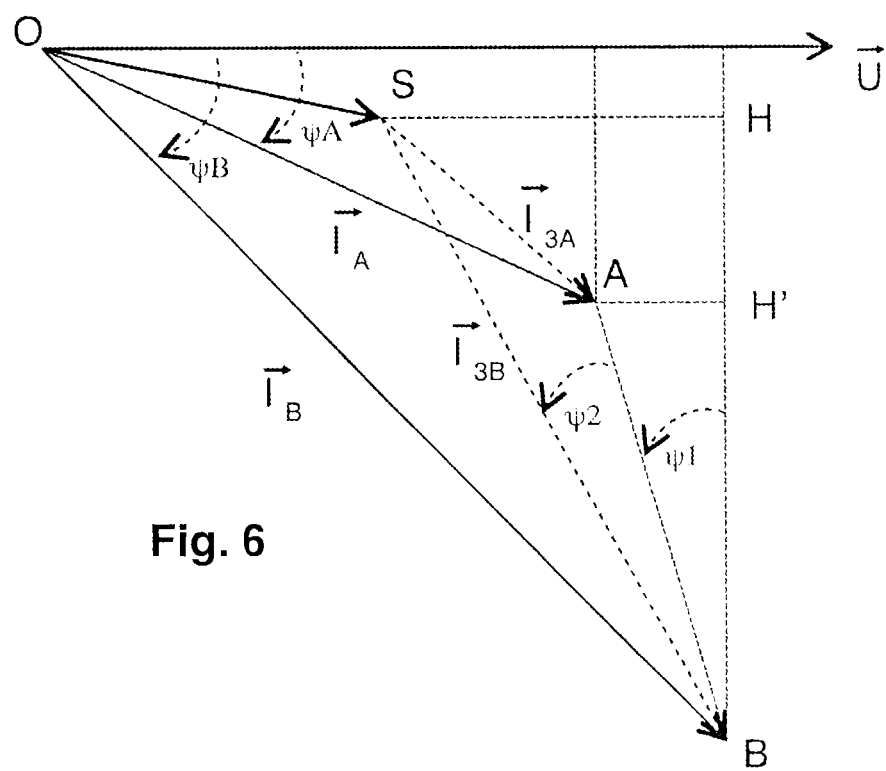

Other advantages and features will become more clearly apparent from the following description of particular embodiments of the invention given for non-restrictive example purposes only and represented in the appended diagrams, among which:

FIG. 2 is a simplified electrical diagram of an electrical installation according to the invention;

FIG. 3 is a flowchart of the operating logic of a method that is according to the invention and that is implemented in the scope of monitoring of individual consumptions constituting the overall consumption of the electrical installation of FIG. 2;

FIG. 4 is a Fresnel diagram illustrating how to proceed with a manner for determining one of the above-mentioned individual consumptions, in the method according to the invention;

FIG. 5 is a Fresnel diagram carrying on from that of FIG. 4 and which further indicates complementary details concerning an operation included in the manner illustrated in this FIG. 4;

FIG. 6 is a Fresnel diagram also carrying on from that of FIG. 4 and which further indicates complementary details concerning a possible way of implementing the manner schematized in this FIG. 4.

DESCRIPTION OF A PREFERRED EMBODIMENT OF THE INVENTION

An electrical installation 1 suitable for implementation of a method according to the invention is represented in FIG. 2. For the sake of clarity, FIG. 2 is simplified and certain conventional constituent components are omitted from it. In particular, only the phase is represented, whereas the neutral is not.

The electrical installation 1 can belong to a final consumer and be located in a block or a building, such as a residential building or an office block, where there are several different loads to be supplied and where an electrical power distribution needs to be performed. This electrical installation 1 can in particular be that of a private home or that of residential lodgings.

The electrical installation 1 is supplied by an electrical power supply with sinusoidal alternating current 2, to which it is connected by an incoming main line or incomer 3 and which can in particular be a public electrical power distribution grid.

Several feeders are connected to the incomer 3. Each of them forms part of one of several branches 4 fitted in parallel, in which loads 5 to be supplied are connected. In the example represented, these branches 4 are four in number. Their number can of course be different from four.

The incomer 3 is equipped with an electrical power consumption meter 6, which measures in time several quantities characteristic of the overall electrical power supply of the group of branches 4, i.e. the overall supply voltage U and the intensity and phase shift values of the overall supply current I flowing in the incomer 3. A device for making the same measurements as the meter 6 can be used instead of the latter, without properly speaking being an electrical power consumption meter.

One or more branches 4 can each be equipped with a current sensor or ampere meter 7. In the represented example, an ampere meter 7 measures the intensity of the individual current $I_3$ in a branch 4.

One or more branches 4 can each be equipped with a current sensor 8. In the represented example, a current sensor 8 detects the flowing or not of an individual current $I_3$ in a branch 4.

One or more branches 4 can each be equipped with an electrical power consumption meter 9, which can be identical to the meter 6. In the represented example, a consumption meter 9 measures in time the power consumed in the branch 4 where the current $I_4$ is flowing. It can also measure several quantities characteristic of the electrical power supply of this branch 4 and enabling the power consumed on it to be determined.

Each of the equipment items formed by the ampere meter 7, current sensor 8 and electrical power consumption meter 9 has at least one transducer transforming electrical quantity into an electric signal representing a measurement or another item of information.

One or more branches 4 can be devoid of such a transducer, which can have the result of their power consumption not being monitored or being in a case where this consumption can be deduced without information from the branch 4 concerned. In the represented example, no measuring or detection apparatus equips the branch 4 in which the current $I_1$ is flowing.

Reference numeral 10 designates a low-voltage general panel where several electric apparatuses are contained, including the electrical power consumption meters 6 and 9, and the ampere meter 7 and current detector 8.

A communication system 11 enables a central electronic measurement unit 12 to communicate with the measuring and detection instrumentation, i.e. the power consumption meters 6 and 9, ampere meter 7 and current detector 8. The central measurement unit 12 collects and records in time, i.e. throughout operation of the electrical installation 1, data coming from the measuring and detection instrumentation. Preferably, data transfers 13 are performed by means of a wireless communication, such as a Hertzian communication, which is the case in the represented example. However, communication 13 between the measuring instrumentation and the central unit 12 can also be hardwired or even mixed.

The data collected by the central unit 12 is recorded by a memory 14 of this central unit 12, which also comprises a computing device 15 to process it.

The electrical power consumption meters 6 and 9, ampere meter 7, current detector 8, communication system 11 and central measurement unit 12 together form the whole or part of a system which is according to the invention and which is more precisely a system for monitoring operation of the electrical installation 1.

This central unit 12 is equipped with at least one input/output port 16 by means of which it can communicate with an external device such as a supervision, monitoring and/or control computer 17, by means of which an operator has filled in a table 18 of the computing device 15 in particular according to the types of loads 5a, 5b, 5c and 5d in the branches 4 and according to the manner in which these branches 4 are consequently instrumented.

The load 5a connected in the branch 4 where the current $I_2$ is flowing has a constant impedance. It consumes an active power and/or a reactive power each of which is either zero when switched off or equal to a substantially fixed value. This value is furthermore a single value in the electrical installation 1, which is recorded in the table 18 by means of a classification of the branch 4 in which the current $I_1$ is flowing in a first category. If a variation of the overall power consumed by this installation 1 is equal to the above-mentioned single value, it is known that this power variation has to be assigned to the branch 4 in which the current $I_1$ is flowing.

The load 5b connected in the branch 4 where the current $I_2$ is flowing has a constant impedance. It consumes an active power and/or a reactive power each of which is either zero when switched off or equal to a substantially fixed value. This value is furthermore a single value in the electrical installation 1, which is recorded in the table 18 by means of a classification of the branch 4 in which the current $I_2$ is flowing in a second category.

In the branch 4 where the current $I_3$ is flowing, the power consumption changes are made in steps due to the nature of its loads 5c. In other words, the power consumed in this branch 4 is substantially stable between two changes, which is recorded in the table 18 by means of a classification of the branch in which the current $I_3$ is flowing in a third category.

In the branch 4 where the current is flowing $I_4$, the active power and/or a reactive power consumed can vary progressively over long time intervals, which is recorded in the table 18 by means of a classification of the branch 4 in which the current $I_4$ is flowing in a fourth category.

The table 18 is filled when a configuration step is performed by an operator and/or by the computing device 15 and in which investigations are carried out to be able to classify each of the branches 4 observed in one of the above-mentioned first, second, third or fourth categories.

The computing device 15 conducts the process the logic of which is represented in FIG. 3. In a first step 20 of this process, the computing device 15 monitors the occurrences of changes affecting the intensities of the currents in the branches 4 and/or the overall consumption of the electrical installation 1. When such a change has been detected, the computing device 15 goes on to a step 21 in which it performs a filtering distinguishing significant and lasting changes from the other insignificant and/or temporary changes.

Significant changes are defined as being greater than a predefined threshold which is chosen taking account of the various data such as the type of use of the electrical installation 1. Temporary changes are defined as having a duration that is longer than a predefined time delay, for example about 2 to 3 s. In the case where the answer to the question of knowing whether the detected change is significant and lasting is negative, the computing device 15 returns to the monitoring step 20. In the opposite case, a step 22 is started.

In this step 22, the computing device 15 determines in which branch 4 the change of power consumption took place. When the change took place in the branch on which the current $I_1$ is flowing, the computing device deduces therefrom that the variation of the overall power consumption by the installation 1 is substantially equal to the power that only the load 5a consumes when it is active. In the other cases, the computing device 15 determines the origin of the change of consumption from information provided by the current detector 8, ampere meter 7 and meter 9.

The computing device 15 has several manners 30, 31, 32 and 33 at its disposal for determining an individual power consumed in a branch 4. Each of these manners of proceeding 30 to 33 is suitable for a case among those corresponding to the above-mentioned first, second, third and fourth categories.

When it knows in which branch 4 the consumed power changed, the computing device 15 selects the manner of proceeding 30, 31, 32 or 33 which will be used to determine the power consumed in this branch 4. To do this, still in step 22, the computing device 15 consults the table 18 which is a correspondence table and where one of the above-mentioned four categories is attributed to each observed branch 4, i.e. one of the manners of proceeding 30 to 33. On completion of step 22, the computing device 15 proceed according to the manner of proceeding 30, 31, 32 or 33 which it has selected.

The manner 30 for determining an individual power is suitable for branches 4 in which the power consumption changes are performed by steps on account of the nature of their loads. In other words, it is suitable when the power consumed in a branch 4 is substantially stable between two changes.

The manner 30 for determining an individual power will now be described in the case of a change of consumption in the branch 4 where the current is flowing $I_3$. In a step 40 of this manner 30, the computing device 15 answers the question of knowing whether the individual current $I_3$ was zero or not before the change.

If the answer is yes, a simplified calculation is performed in step 41 and consists in determining the individual power consumed in the loads 5c after the change as being equal to the variation of the overall power consumed by the electrical installation and determined by the power consumption meter 6 or solely from its measurements of the characteristic quantities of the overall electrical power supply of the group of branches 4, i.e. voltage, current intensity and phase shift values of this power supply.

If the individual current $I_3$ was not zero before the change, the computing device 15 executes step 42 wherein it determines the new individual power consumed in the branch 4 in which this current $I_3$ is flowing and wherein it proceeds in a manner explained below by means of the Fresnel diagram of FIG. 4.

This way of proceeding considers that the electrical installation 1 is supplied by a substantially sinusoidal current, with no or little harmonic distortion. In the case of harmonic distortions, the individual power determined by the computing device 15 will be less precise.

At least in the power calculation formulas presented in the following and/or in the appended claims, the voltage and current values mentioned are rms values.

Represented by the vector $\vec{U}$ in FIG. 4, the voltage at the terminals of each branch 4 is the overall supply voltage U of the installation 1. The change of power consumption only has a very slight if not insignificant effect on the latter. It is therefore considered that this overall voltage U is not modified when the change of power consumption takes place. This change does on the other hand affect the overall current I in the same way as the individual current $I_3$.

In FIG. 4, the vector $\vec{I}_A$ and the vector $\vec{I}_{3A}$ are respectively the graphic representation of the overall current I and the graphic representation of the individual current $I_3$ at the same time, which is a first time located before the change.

Vector $\vec{I}_B$ and vector $\vec{I}_{3B}$ are respectively the graphic representation of the overall current I and the graphic representation of the individual current $I_3$ at another time, which is a second time located after the change. Both the first and second times are chosen outside the change phase proper. In other words, each of them is located in a stabilized and constant operating phase of the electrical installation 1 so that transients are excluded therefrom.

The voltage, intensity and phase shift values measured by the meter 6 determine the vectors $\vec{U}$, $\vec{I}_A$ and $\vec{I}_B$, which are therefore known. The quantities characterizing the individual current $I_3$ are on the other hand not all measured. In fact only the intensities are measured, except for phase shifts, in so far as this individual current $I_3$ is concerned.

A power variation only occurred in the branch 4 where the current $I_3$ is flowing. The set of individual currents flowing in the other branches 4, therefore except for the individual current $I_3$, add up to a substantially unchanged sum between the first time before the change of power consumption and the second time after this change. In the example considered, this sum is the sum of the currents $I_1$ and $I_2$. Its graphic representation in FIG. 3 is the vector $\vec{OS}$, where O is the origin of an orthonormal coordinates system.

As this vector $\vec{OS}$ is the same before and after the change, the following therefore both have to be met:

that $\vec{OS} + \vec{I}_{3A} = \vec{I}_A (= \vec{OA})$, and that $\vec{OS} + \vec{I}_{3B} = \vec{I}_B (= \vec{OB})$.

This is illustrated by FIG. 4.

The norm of the vector $\vec{I}_{3A}$ is the measurement $I_{3A}$ of the current intensity $I_3$ before the change. The norm of the vector $\vec{I}_{3B}$ is the measurement $I_{3B}$ of the current intensity $I_3$ after the change. The point S is the intersection of two circles, i.e. a circle with centre A and with an intensity radius $I_{3A}$ of the current $I_3$ as measured before the change and a circle with centre B and with an intensity radius $I_{3B}$ of the current $I_3$ as measured after the change.

On the basis of the foregoing, a first way of proceeding is to numerically solve a system of two equations with two unknowns, as follows:

$$\begin{cases} (X_A - X_S)^2 + (Y_A - Y_S)^2 = I_{3A}^2 \\ (X_B - X_S)^2 + (Y_B - Y_S)^2 = I_{3B}^2 \end{cases} \quad (1)$$

$X_A$ and $Y_A$ are the Cartesian coordinates of the vector $\vec{I}_A$ in the above-mentioned orthonormal reference system, only the origin O of which is represented for the sake of clarity.

$X_B$ and $Y_B$ are the Cartesian coordinates of the vector $\vec{I}_B$ in the same above-mentioned orthonormal reference system.

$X_S$ and $Y_S$ are two unknowns and are the Cartesian coordinates of the vector $\vec{OS}$, again in the same orthonormal reference system.

The computing device 15 can solve the system (1) of equations with two unknowns by means of a mathematical numerical resolution method which is based on a progressive variation of $X_S$ and $Y_S$, being controlled by a relevant convergence criterion.

For example, a numerical determination method of the point S can consist in moving step by step on one of the above-mentioned circles, which are the circle with centre A and intensity radius $I_{3A}$ and the circle with centre B and intensity radius $I_{3B}$. At each step on one of the circles, it is checked whether or not the location is in the immediate vicinity to the other circle.

It should be noted that system (1) has two solutions which correspond to the points S and S' in FIG. 4. The point S' corresponds to a physically aberrant solution which has to be eliminated to only keep the other solution, that corresponding to the point S.

Elimination of the point S' can be performed by calculating, for each of the points S and S', the active and reactive powers before and after the observed power variation and in only retaining the one of the two points S and S' for which these powers meet the following criteria:

the active powers before and after the power variation have to be positive, considering that the loads 5c are assumed to consume and not to supply active power, the reactive powers before and after the power variation have to be of the same sign and be consistent with the nature of the load or loads 5c in the branch 4, i.e.

positive in the case of capacitive loads 5c and negative in the case of inductive loads 5c.

Once the point S has been determined, the vector $\vec{I}_{3B}$ and the intensity and phase shift values characteristic of the new current $I_3$ are easily determined by means of the following relation: $\vec{I}_{3B} = \vec{I}_B - \vec{OS}$.

The new power $P_{3B}$, i.e. subsequent to the change and consumed in the branch 4 where the current is flowing $I_3$, is then calculated by the computing device 15 as being the scalar product of the vectors $\vec{U}$ and $\vec{I}_{3B}$: $P_{3B} = \vec{U} \cdot \vec{I}_{3B}$.

The former power $P_{3A}$ in this branch 4 can also be calculated, in similar manner, i.e. by means of the relationship $P_{3A} = \vec{U} \cdot \vec{I}_{3A}$.

FIG. 6 illustrates geometric and trigonometric relations which are used in a second manner of proceeding to determine the power consumed in the branch 4 where the current $I_3$ is flowing. Instead of or as a complement to the first manner of proceeding set out in the foregoing, the computing device 15 can implement this second manner of proceeding which is based on analytical calculation and which will now be dealt with.

In the triangle AOB visible in FIG. 6, we have the following relation:

$$AB^2 = I_A^2 + I_B^2 - 2 \times I_A \times I_B \times \cos(\text{angle} AOB) \quad (2)$$

$I_A$ and $I_B$ are respectively a measurement of the intensity of the former overall current I (before the change) and a measurement of the intensity of the new overall current I (after the change).

From relation (2), the following equality is deduced:

$$AB = \sqrt{I_A^2 + I_B^2 - 2 \times I_A \times I_B \times \cos(\psi_B - \psi_A)} \quad (3)$$

$\psi_A$ and $\psi_B$ are respectively a measurement of the phase shift of the former overall current I and a measurement of the phase shift of the new overall current I.

According to the second way of proceeding, the computing device 15 determines the intensity value AB by means of the equality (3).

Furthermore, we have the following relation:

$$P_B - P_A = U \times AB \times \sin(\psi_1) \quad (4)$$

$P_A$ is the former overall power consumed by the electrical installation 1, i.e by the set of branches 4, as measured by the meter 6 before the change. $P_B$ is the new overall power consumed by this electrical installation 1, as measured by the meter 6 after the change. U is a measurement of the overall voltage at the terminals of the group of branches 4.

From relation (4), the following equality is deduced:

$$\psi_1 = \arcsin\left(\frac{I_B \times \cos\psi_B - I_A \times \cos\psi_A}{AB}\right) \quad (5)$$

According to the second way of proceeding, the computing device 15 determines the value of angle $\psi_1$ by means of the equality (5).

In the triangle ABS visible in FIG. 6, we have the following relation:

$$SA^2 = SB^2 + AB^2 - 2 \times SB \times AB \times \cos\psi_2 \quad (6)$$

From relation (6), the following equality is deduced:

$$\psi_2 = \arccos\left(\frac{I_{3B}^2 + AB^2 - I_{3A}^2}{2 \times I_{3B} \times AB}\right) \quad (7)$$

According to the second way of proceeding, the computing device 15 determines the value of angle $\psi_2$ by means of equality (7).

Furthermore, we have the following relation:

$$SH = SB \times \sin(\psi_1 + \psi_2) \quad (8)$$

From relation (8), the following equality is deduced:

$$P_{3B} = U \times I_{3B} \times \sin(\psi_1 + \psi_2) \quad (9)$$

According to the second way of proceeding, the computing device 15 uses the equality (9) to determine the new individual power $P_{3B}$ in the branch 4 where the current $I_3$ is flowing.

Naturally, the formulas used can present another form than equalities (3), (5), (7) and (9), while remaining within the second way of proceeding which has just been dealt with. For example, equalities (3), (5), (7) and (9) can be combined in the direction of a reduction of the number of formulas used. In particular, equality (3) can be incorporated in equality (5), and also in equality (7), whereas these equalities (5) and (7) can be incorporated in equality (9).

The computing device 15 can also determine the phase shift $\psi_{3B}$ of the new current $I_3$, i.e. of the current $I_3$ after the change, by means of the following relation:

$$\psi_{3B} = \pi/2 - (\psi_1 + \psi_2) \quad (10)$$

The computing device 15 can also determine the former individual power $P_{3A}$, i.e. the power consumed before the change, in the branch 4 where the current $I_3$ is flowing. To do this, it can use the following relation:

$$P_{3A} = P_{3B} - (P_B - P_A) \quad (11)$$

The computing device 15 can also determine the new individual reactive power $Q_{3B}$, i.e. the reactive power after the change, in the branch 4 where the current $I_3$ is flowing. To do this, it can use the following relation:

$$Q_{3B} = U \times I_{3B} \times \cos(\psi_1 + \psi_2) \quad (12)$$

The computing device 15 can also determine the former individual reactive power $Q_{3A}$, i.e. the reactive power before the change, in the branch 4 where the current $I_3$ is flowing. To do this, it can use the following relation:

$$Q_{3A} = Q_{3B} - (Q_B - Q_A) \quad (13)$$

Like the first way of proceeding using a numerical resolution, the second way of proceeding based on a trigonometric resolution gives two solutions which correspond to the points S and S' of FIG. 5. These two solutions arise from the fact that the arcsinus calculation in formula (5) can be attributed a positive or negative value. The aberrant solution corresponding to the point S' is eliminated in the second way of proceeding as it is in the first way of proceeding.

From its description above in the case of single-phase, the manner 30 for determining an puissance individual power can be transposed without any particular difficulty to the case of an electrical installation for multiphase currents. For the sake of clarity, its transposition to this case of an electrical installation for multiphase currents is not described in detail in the following.

The manner 31 for determining an individual power is suitable in the case of a branch 4 which is equipped with a current detector or with another means for detecting flow or lack of flow of a current and which has a load of fixed impedance. In the example represented, the manner 31 for determining an individual power is suitable for evaluating the individual power consumed by the load 5b. In this manner 31, the individual power in the branch 4 comprising the load 5b is calculated as being equal to the variation of the overall power at the time a change of consumption takes place in this branch 4, if flow of a current $I_2$ is detected after the change. The overall power is the power consumed by all of the branches 4. It is measured by the electrical power consumption meter 6 or from measurements made by the latter. When no current $I_2$ is detected, the power consumed in the branch 4 comprising the load 5b is considered as being zero.

The manner 32 for determining an individual power is used in the case of a load having a non-constant impedance which can vary progressively. In the example represented, the manner 32 for determining an individual power is used to determine the individual power consumed by the load 5d. In this manner 32, the individual power in the branch 4 comprising the load 5d is measured by the electrical power consumption meter 9 or deduced from the measurements made by the latter.

Advantageously, the electrical power consumption meter 9 can be calibrated using regiments made by the consumption meter 6 and the simplified calculation 41 that the manner 30 for determining an individual power comprises. Calibration of the consumption meter 9 can present the form of a correction made by the computing device 15, at the level of this computing device, on the received measurements, and not at the level of consumption meter 9. This calibration can take place when the consumption meter 9 is first commissioned in the electrical installation 1, and then at regular intervals. By means of this, consumption meter 9 may lack exactitude provided that it produces a faithful measurement. In particular, the meter 9 does not need to be calibrated in the plant and it can be less expensive.

The manner 33 for determining an individual power is suitable in the case of a branch 4 which has a load of single fixed impedance throughout the whole electrical installation 1. In the example represented, the manner 33 for determining an individual power is suitable for evaluating the individual power consumed by the load 5a. In this manner 33, the individual power in the branch 4 comprising the load 5a is calculated as being equal to a variation of the overall power in the set of branches 4, if this variation is of positive sign and in the region of the single power that the load 5a can consume. When a variation of the overall power is a negative sign and it is in the region of this single power, the power consumed in the branch 4 comprising the load 5a is considered as being zero.

The individual power consumed in a branch 4 is calculated by integrating over time the individual power that was evaluated or measured in this branch 4 by one of the manners 30 to 33. Integration of the individual power over time uses a recording of the chronology of the power consumption changes in the branches 4.

According to an alternative according to the invention, the electrical installation 1 is a direct current installation which is connected to an electrical power supply 2 supplying a DC voltage. In this case, the measuring and detection instrumentation is adapted accordingly, whereas step 42 is simplified. Naturally, there is no phase shift to be measured or to be determined in another manner. In the simplified step 42, the power consumed in the branch 4 in which the current $I_3$ is flowing is determined from a measurement of the intensity of this current I₃ and from a measurement of the overall supply voltage U of the group of branches 4, as being the product of one another. The power in the branch 4 in which the current I₄ is flowing can be obtained in the same manner, so that this branch 4 can be equipped with a single ampere meter. The manner 31 for determining an individual power is similar in alternating current and in direct current. The same is true for the manner 33 for determining an individual power.

The invention is not limited to the embodiments described in the foregoing. In particular, when it is used in the scope of an alternating current power supply, the invention is not limited to the case of single-phase but can on the contrary also be implemented in electrical installations for multiphase currents. Furthermore, the field of the invention covers both medium and high voltage as well as low voltage, even if the example described in the foregoing is situated in the low voltage field.

The invention claimed is:

1. A method for determining a power consumption in an electrical installation including a plurality of electricity distribution branches, and an incoming main power line connecting the plurality of electricity distribution branches to an electrical power supply, the method comprising:
   measuring a first power on the incoming main power line to identify an overall power consumption by the plurality of electricity distribution branches and recording, as first measurement data, the first power measured on the incoming main power line;
   detecting a change in the power consumption in the electrical installation;
   measuring a second power on the incoming main power line to identify an overall power consumption by the plurality of electricity distribution branches after the change and recording, as second measurement data, the second power measured on the incoming main power line;
   collecting, by a transducer located in a specific branch of the plurality of electricity distribution branches, information relating to an electric current in the specific branch;
   determining, by circuitry based on the information collected by the transducer, whether the change occurred in the specific branch;
   determining, by the circuitry based on the first measurement data, the second measurement data and a result of the determining of whether the change occurred in the specific branch, an individual power consumption in the specific branch; and
   determining, by the circuitry when the specific branch does not include the transducer, the individual power consumption in the specific branch based on the first measurement data, the second measurement data and a plurality of information, wherein
   each of the plurality of information relates to a corresponding electric current in each of a rest of the plurality of electricity distribution branches, the rest excluding the specific branch, and
   the each of the plurality of information is collected by a corresponding transducer located in the each of the rest of the plurality of electricity distribution branches.

2. The method for determining a power consumption according to claim 1, further comprising:
   generating a table that includes a plurality of associations between the plurality of electricity distribution branches and a set of plural manners, the plurality of associations including at least one association between the specific branch and at least one of the set of plural manners, and the set of plural manners being for determining an individual power consumption in a branch;
   combining the result of the determining and the table;
   selecting a manner from the set of plural manners; and
   determining, according to the selected manner, the individual power consumption in the specific branch.

3. The method for determining a power consumption according to claim 2, wherein
   the plurality of electricity distribution branches are connected in parallel,
   the electrical power supply is an alternating current supply, and
   a specific manner from the set of plural manners comprises:
      measuring and recording an overall supply voltage of the plurality of electricity distribution branches;
      measuring and recording an intensity and phase shift values of an overall supply current of the plurality of electricity distribution branches;
      measuring and recording an intensity of a specific individual current flowing in a specific branch of the plurality of electricity distribution branches; and
      determining, based on the measuring of the overall supply voltage during the change, the measuring of the intensity and phase shift values of the overall current before and after the change, and the measuring of the intensities of the specific individual current before and after the change, the individual power consumption in the specific branch.

4. The method according to claim 3, wherein
   the individual power consumption is determined by adding up, as an unchanged sum, a plurality of individual currents flowing in the plurality of electricity distribution branches with exception of the specific individual current flowing in the specific branch on completion of the change, and comparing the unchanged sum with the measuring of the intensity and phase shift values of the overall current before the change, and
   following two conditions are simultaneously complied with:
      the overall supply current before the change is equal to a first amount of adding the unchanged sum to the specific individual current before the change, and
      the overall supply current after the change is equal to a second amount of adding the unchanged sum to the specific individual current after the change.

5. The method for determining a power consumption according to claim 2, wherein
   the plurality of electricity distribution branches are connected in parallel,
   the electrical power supply is a direct current supply, and
   a specific manner from the set of plural manners comprises:
      measuring an overall supply voltage of the plurality of electricity distribution branches;
      measuring an intensity of a specific individual current flowing in a specific branch of the plurality of electricity distribution branches; and
      determining, based on the measuring of the overall supply voltage and the measuring of the intensity of the specific individual current, the individual power consumption in the specific branch.

6. The method for determining a power consumption according to claim 2, wherein the one of the set of plural manners for determining the individual power consumption determines that an individual power consumption in one of the plurality of electricity distribution branches is equal to difference between an overall power consumption in the plurality of electricity distribution branches before the change and an overall power consumption in the plurality of electricity distribution branches after the change.

7. A monitoring system of a plurality of electricity distribution branches in an electrical installation, comprising:
a measuring device that measures a first power on an incoming main power line to identify an overall power consumption by the plurality of electricity distribution branches, the incoming main power line connecting the plurality of electricity distribution branches to an electrical power supply;
a memory that records, as first measurement data, the first power measured on the incoming main power line;
a transducer located in a specific branch among the plurality of electricity distribution branches; and
circuitry configured to:
detect a change in a power consumption in the electrical installation, by communicating with at least one of the measuring device and the transducer, wherein the measuring device measures a second power on the incoming main power line to identify an overall power consumption by the plurality of electricity distribution branches after the change and records, on the memory as second measurement data, the second power measured on the incoming main power line;
monitor information relative to an electrical current in the specific branch, the information originating from the transducer;
determine, based on the information originating from the transducer, whether the change occurred in the specific branch;
determine, based on the first measurement data, the second measurement data and a result of the determining of whether the change occurred in the specific branch, an individual power consumption in the specific branch; and
determine, when the specific branch does not include the transducer, the individual power consumption in the specific branch based on the first measurement data before the change, the second measurement data after the change and a plurality of information, wherein
each of the plurality of information relates to a corresponding electric current in each of a rest of the plurality of electricity distribution branches, the rest excluding the specific branch, and
the each of the plurality of information is collected by a corresponding transducer located in the each of the rest of the plurality of electricity distribution branches.

8. The monitoring system according to claim 7, wherein the circuitry includes a set of plural manners for determining an individual power consumption in a branch of the plurality of electricity distribution branches, and
the circuitry is configured to:
generate a table that includes a plurality of associations between the plurality of electricity distribution branches and a set of plural manners, the plurality of associations including at least one association between the specific branch and at least one of the set of plural manners, and the set of plural manners being for determining an individual power consumption in a branch;
combine the result of the determining and the table;
select a specific manner from the set of plural manners for determining the individual consumption; and
determine the specific individual power consumption according to the selected specific manner.

9. The monitoring system according to claim 7, for an alternating current electrical installation, wherein
the monitoring system is configured to:
measure and record an overall supply voltage of the plurality of electricity distribution branches,
measure and record an intensity and phase shift values of an overall supply current of the plurality of electricity distribution branches,
measure and record an intensity of a specific individual current flowing in a specific branch of the plurality of electricity distribution branches, and
the circuitry is configured to determine the individual power consumption in the specific branch, based on the measuring of the overall supply voltage during the change, the measurings of the intensity and phase shift values of the overall supply current before and after the change, and the measurings of the intensities of the specific individual current before and after the change.

10. The monitoring system according to claim 9, wherein
the circuitry is configured to determine the individual power consumption in the specific branch by adding up, as an unchanged sum, a plurality of individual currents flowing in the plurality of electricity distribution branches with exception of the specific individual current on completion of the change, and comparing the unchanged sum with the measuring of the intensity and phase shift values of the overall supply current before the change, and
following two conditions are simultaneously complied with:
the overall supply current before the change is equal to a first amount of adding the unchanged sum to the specific individual current before the change, and
the overall supply current after the change is equal to a second amount of adding the unchanged sum to the specific individual current after the change.

11. The monitoring system according to claim 7, wherein the circuitry is configured to determine that an individual power consumption in one of the plurality of electricity distribution branches is equal to difference between an overall power consumption in the plurality of electricity distribution branches before the change and an overall power consumption in the plurality of electricity distribution branches after the change.

12. A monitoring system for determining a power consumption in an electrical installation including a plurality of electricity distribution branches, and an incoming main power line connecting the plurality of electricity distribution branches to an electrical power supply, the monitoring system comprising:
circuitry configured to:
measure a first power on the incoming main power line to identify an overall power consumption by the plurality of electricity distribution branches and record, as first measurement data, the first power measured on the incoming main power line;
detect a change in the power consumption in the electrical installation;

measure a second power on the incoming main power line to identify an overall power consumption by the plurality of electricity distribution branches after the change and recording, as second measurement data, the second power measured on the incoming main power line;

monitor information relating to an electric current in a specific branch among the plurality of electricity distribution branches, the information collected by a transducer, and the transducer located in the specific branch;

determine, based on the information collected by the transducer, whether the change occurred in the specific branch;

determine, based on the first measurement data before the change, the second measurement data after the change and a result of the determining of whether or not the change occurred in the specific branch, an individual power consumption in the specific branch; and determine, when the specific branch does not include the transducer, the individual power consumption in the specific branch based on the first measurement data before the change, the second measurement data after the change and a plurality of information, wherein each of the plurality of information relates to a corresponding electric current in each of a rest of the plurality of electricity distribution branches, the rest excluding the specific branch, and the each of the plurality of information is collected by a corresponding transducer located in the each of the rest of the plurality of electricity distribution branches.

13. An electrical installation, comprising:

a plurality of electricity distribution branches between plural loads;

an incoming main power line connecting the plurality of electricity distribution branches to an electrical power supply;

a monitoring system, wherein a measuring device that measures a first power on an incoming main line to identify an overall power consumption by the plurality of electricity distribution branches, a specific branch among the plurality of electricity distribution branches including a transducer, a memory that records, as first measurement data, the first power measured on the incoming main power line, and circuitry configured to:

detect a change in a power consumption in the electrical installation, by communicating with at least one of the measuring device and the transducer, wherein the measuring device measures a second power on the incoming main power line to identify an overall power consumption by the plurality of electricity distribution branches after the change and records, on the memory as second measurement data, the second power measured on the incoming main power line;

monitor information relative to an electrical current in the specific branch, the information originating from the transducer located in the specific branch;

determine, based on the information originating from the transducer whether the change occurred in the specific branch; and determine, based on the first measurement data before the change, the second measurement data after the change and a result of the determining of whether the change occurred in the specific branch, an individual power consumption in the specific branch; and determine, when the specific branch does not include the transducer, the individual power consumption in the specific branch based on the first measurement data before the change, the second measurement data after the change and a plurality of information, wherein each of the plurality of information relates to a corresponding electric current in each of a rest of the plurality of electricity distribution branches, the rest excluding the specific branch, and the each of the plurality of information is collected by a corresponding transducer located in the each of the rest of the plurality of electricity distribution branches.

\* \* \* \* \*